United States Patent
Michii et al.

(10) Patent No.: US 6,836,007 B2
(45) Date of Patent: Dec. 28, 2004

(54) SEMICONDUCTOR PACKAGE INCLUDING STACKED SEMICONDUCTOR CHIPS

(75) Inventors: Kazunari Michii, Hyogo (JP); Jun Shibata, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/383,734

(22) Filed: Mar. 10, 2003

(65) Prior Publication Data

US 2004/0061211 A1 Apr. 1, 2004

(30) Foreign Application Priority Data

Oct. 1, 2002 (JP) ........................................ 2002-288967

(51) Int. Cl.[7] ........................ H01L 23/52; H01L 23/495; H01L 23/522; H01L 25/065; H05K 1/02
(52) U.S. Cl. ..................... 257/686; 257/777; 257/673; 257/723; 257/734; 257/738; 257/737; 257/691; 257/698; 257/666; 257/676; 257/211; 257/207; 257/208; 257/668
(58) Field of Search ................................. 257/686, 777, 257/685, 723, 737, 738, 784, 786, 666, 673, 696, 698, 691, 211, 208, 207, 668

(56) References Cited

U.S. PATENT DOCUMENTS

| | | | | |
|---|---|---|---|---|
| 5,998,860 A | * | 12/1999 | Chan et al. | 257/679 |
| 6,013,948 A | * | 1/2000 | Akram et al. | 257/698 |
| 6,020,629 A | * | 2/2000 | Farnworth et al. | 257/686 |
| 6,093,969 A | * | 7/2000 | Lin | 257/777 |
| 6,180,881 B1 | * | 1/2001 | Isaak | 174/52.4 |
| 6,294,825 B1 | * | 9/2001 | Bolken et al. | 257/676 |
| 6,331,453 B1 | * | 12/2001 | Bolken et al. | 438/127 |
| 6,448,640 B2 | * | 9/2002 | Corisis | 257/691 |
| 6,507,107 B2 | * | 1/2003 | Vaiyapuri | 257/723 |
| 6,583,502 B2 | * | 6/2003 | Lee et al. | 257/686 |
| 2001/0006258 A1 | * | 7/2001 | Hur | 257/777 |
| 2003/0001288 A1 | * | 1/2003 | Tay et al. | 257/780 |
| 2003/0006496 A1 | * | 1/2003 | Vaiyapuri | 257/686 |
| 2003/0197271 A1 | * | 10/2003 | Corisis et al. | 257/738 |

FOREIGN PATENT DOCUMENTS

| | | |
|---|---|---|
| JP | 04-340267 | 11/1992 |
| JP | 05-82719 | 4/1993 |
| JP | 06-216182 | 8/1994 |
| JP | P2000-340737 A | 12/2000 |

* cited by examiner

Primary Examiner—Alexander Oscar Williams
(74) Attorney, Agent, or Firm—McDermott Will & Emery LLP

(57) ABSTRACT

A semiconductor package includes an upper substrate having an opening portion, a solder ball for connection between substrates arranged on the lower side of the upper substrate, a lower substrate arranged on the further lower side and having an opening portion, a solder ball for external connection connected on the lower surface of the lower substrate, and a semiconductor chip affixed on each substrate. The semiconductor chip is electrically connected to the solder ball through the opening portion of each substrate. The solder ball for connection between substrates is electrically connected to the solder ball for external connection.

3 Claims, 6 Drawing Sheets

SEMICONDUCTOR PACKAGE INCLUDING STACKED SEMICONDUCTOR CHIPS

BACKGROUND OF THE INVENTION

1. Field of the Invention

The present invention relates to a semiconductor package.

2. Description of the Background Art

With higher functionality of personal computers, memory has to be larger in capacity and faster in speed in semiconductor packages. As semiconductor packages corresponding to the increased speed, BGA (Ball Grid Array) packages are most common which require shorter interconnection distances within packages.

DRAMs (Dynamic Random Access Memory) are representative semiconductor chips used as memory. A DRAM generally has a bonding pad arranged on the center portion of the main surface of the chip. Therefore in mounting a DRAM on a substrate, the substrate is provided with an opening portion like a window frame and the DRAM is bonded on the substrate such that that part of the DRAM at which a bonding pad is arranged can be seen from this opening portion. Here, for the sake of illustration, it is assumed that DRAM is arranged on the upper side of the substrate with the bonding pad directed downward being exposed from the opening portion of the substrate. A bonding pad is also provided at the surrounding of the opening portion of the lower surface of the substrate. Through this opening portion, the bonding pad on the DRAM side is connected to the bonding pad on the substrate side using wire. Thereafter the opening portion is sealed with resin to wrap up that part of the lower surface of the DRAM at which the boding pad is arranged and the wire. The upper side of DRAM is also sealed with resin for protection. Solder balls for external connection are provided on the lower surface of the substrate. This state is generally called a BGA package.

In order to increase a memory capacity, a technique for stacking the aforementioned BGA packages may be contemplated. When two BGA packages are simply stacked to form a stacked package, a resin sealing portion for protecting a wire bonding portion is protruded on the lower surface of the upper BGA package while a resin sealing portion for protecting the DRAM body itself is protruded on the upper surface of the lower BGA package. Therefore when two BGA packages are stacked, the distance between the substrates is inevitably increased because of the heights of the resin sealing portions respectively protruding from the upper and lower substrates. When the upper and lower substrates are connected with solder balls for external connection of the upper BGA package, it becomes necessary to use a solder ball with a large diameter. To reduce the area occupied by the stacked package, the arrangement of the solder balls is preferably in a line for one side even in the case of the solder balls for connection between substrates. In one line, however, the spacing between solder balls is so narrowed that short-circuit is likely to occur. Furthermore, in the case of such a stacked package, as for the interconnection distance from the solder ball for external connection to DRAM included in each of the upper and lower BGA packages, the upper one is largely longer than the lower one thereby causing a transmission delay of a signal.

SUMMARY OF THE INVENTION

The object of the present invention is to provide a semiconductor package that allows memory to be increased in capacity with a reduced package size as a whole, and is free from a transmission delay between upper and lower levels.

In order to attain the aforementioned object, a semiconductor package in accordance with the present invention includes: an upper substrate having an opening portion; a solder ball for connection between substrates that is arranged on a lower side of the upper substrate; a lower substrate arranged on a lower side of the solder ball for connection between substrates and having an opening portion; a solder ball for external connection connected on a lower surface of the lower substrate; a first semiconductor chip arranged on an upper surface of the upper substrate; and a second semiconductor chip arranged on a lower surface of the lower substrate. The aforementioned first semiconductor chip is electrically connected to the solder ball for connection between substrates through the opening portion of the upper substrate. The aforementioned second semiconductor chip is electrically connected to the solder ball for connection between substrates through the opening portion of the lower substrate. The aforementioned solder ball for connection between substrates is electrically connected to the solder ball for external connection.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
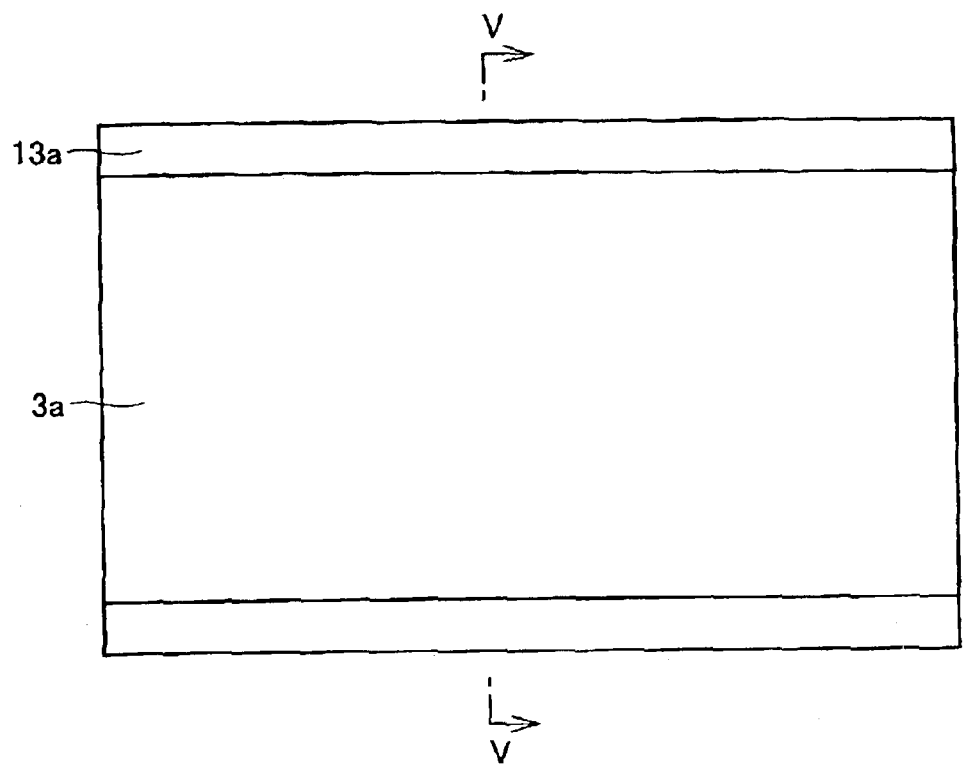
FIG. 1 is a planar view of a semiconductor package in accordance with a first embodiment of the present invention.
Figure 2:
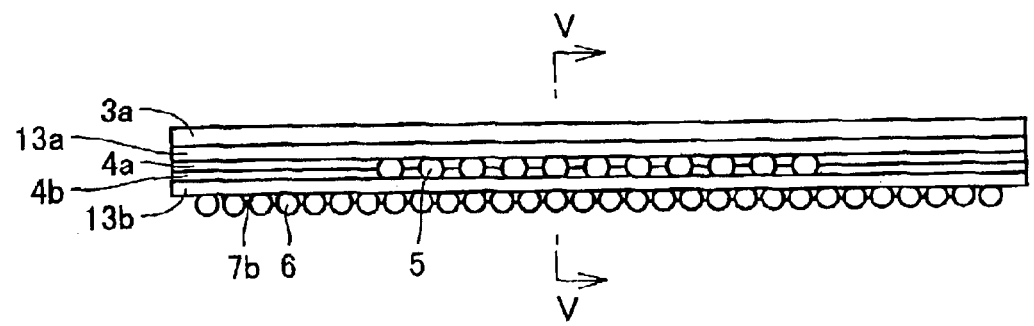
FIG. 2 is a side view of the semiconductor package in accordance with the first embodiment of the present invention.
Figure 3:
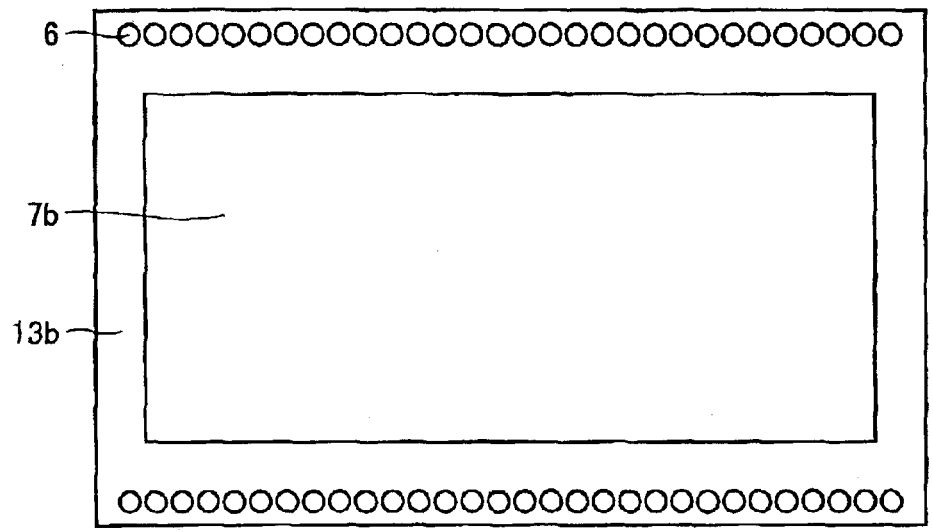
FIG. 3 is an underside view of the semiconductor package in accordance with the first embodiment of the present invention.
Figure 4:
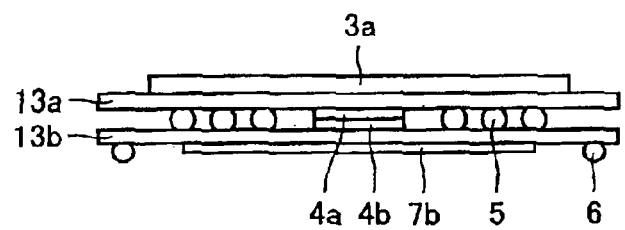
FIG. 4 is a front view of the semiconductor package in accordance with the first embodiment of the present invention.
Figure 5:
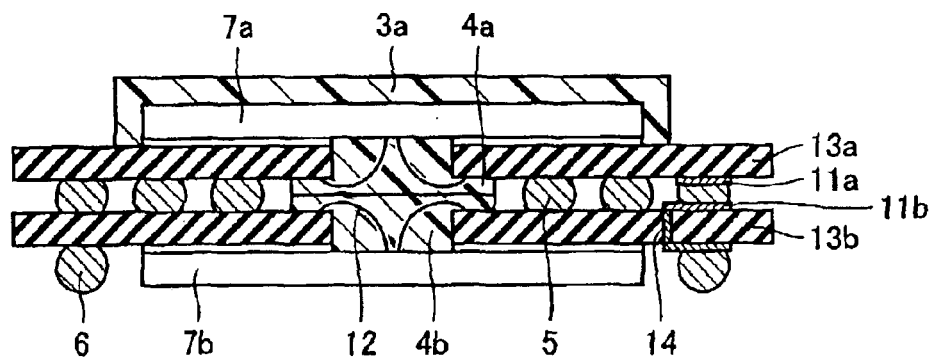
FIG. 5 is a cross sectional view taken along a line V—V viewed in the direction of arrows.

Referring to FIGS. 1–8, a semiconductor package in accordance with a first embodiment of the present invention will be illustrated. The planar view of the semiconductor package is shown in FIG. 1 and the underside view is shown in FIG. 3. Similarly, the front view is shown in FIG. 4 and the side view is shown in FIG. 2. A cross sectional view taken along a line V—V viewed in the direction of arrows in FIG. 1 or 2 is schematically shown in FIG. 5. As shown in FIG. 5, this semiconductor package includes an upper substrate 13a, and a lower substrate 13b connected through solder balls on the upper side thereof. Upper substrate 13a and lower substrate 13b each has an opening portion at the center. Upper substrate 13a and lower substrate 13b each has bonding pads on the surface of the surrounding of the opening portion. In a position in FIG. 5, upper substrate 13a and lower substrate 13b are arranged in the direction in which the bonding pads are opposed to each other.

Semiconductor chip 7a, 7b is for example a DRAM and has a structure having a plurality of bonding pads arranged at the center on the main surface. Semiconductor chip 7a is affixed on the upper surface of upper substrate 13a such that the bonding pad is exposed downward from the opening portion of upper substrate 13a. Semiconductor chip 7b is affixed on the lower surface of lower substrate 13b such that the bonding pad is exposed upward from the opening portion of lower substrate 13b. In other words, semiconductor chips 7a and 7b are arranged in the direction in which the bonding pads are opposed to each other.

The bonding pads of semiconductor chips 7a and 7b and the bonding pads of upper substrate 13a and lower substrate 13b are electrically connected with wires 12 as shown in FIG. 5. Those wire bonding portions are sealed with resin, serving as resin sealing portions 4a and 4b respectively above and below. Resin sealing portion 4a and resin sealing portion 4b are in close proximity above and below but not connected to each other, and they are separately formed resin portions.

On the upper side of upper substrate 13a, a resin sealing portion 3a is formed to cover the body of semiconductor chip 7a for the purpose of protecting the body of semiconductor chip 7a. On the lower side of lower substrate 13b, a resin portion to cover the body of semiconductor chip 7b does not exist.

In the proximity of the outer edge of the lower surface of lower substrate 13b, a solder ball 6 for external connection is arranged.

Figure 6:
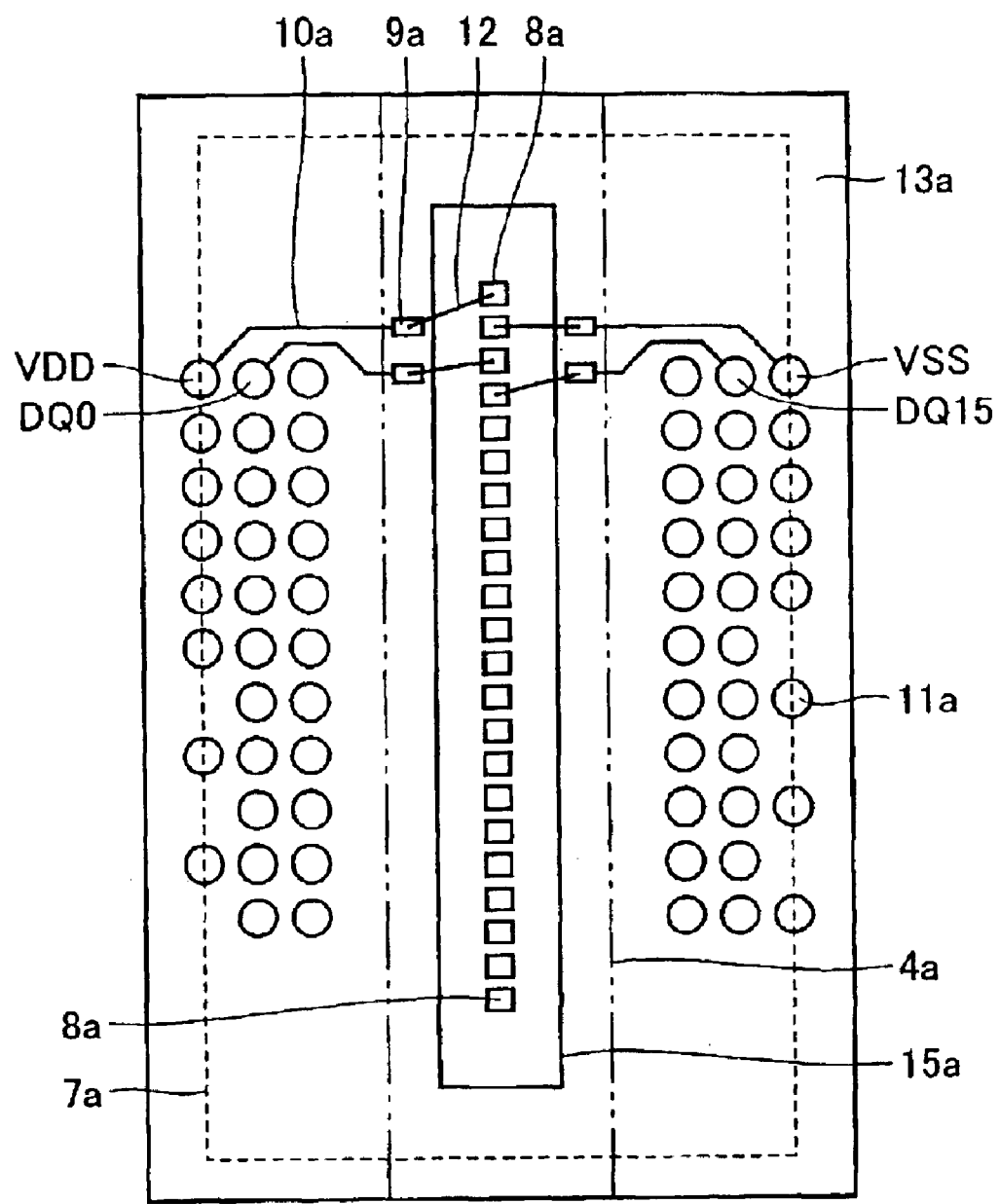
FIG. 6 is an underside view of the upper BGA package with a resin sealing portion removed for the sake of illustration where the semiconductor package in accordance with the first embodiment of the present invention is separated into two upper and lower BGA packages.
Figure 7:
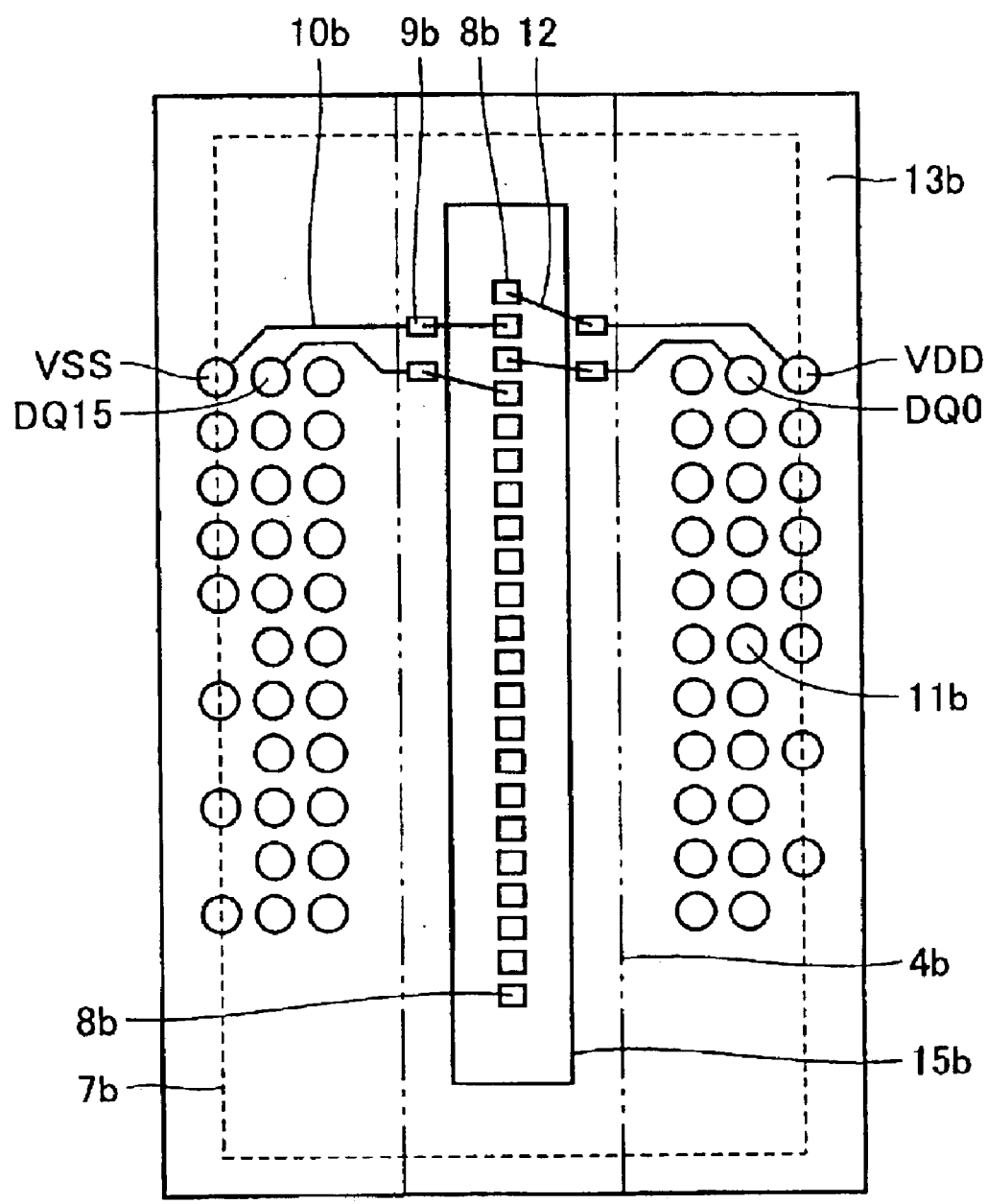
FIG. 7 is an underside view of the lower BGA package with a resin sealing portion removed for the sake of illustration where the semiconductor package in accordance with the first embodiment of the present invention is separated into two upper and lower BGA packages.

A plurality of lands 11a are arranged on the lower surface of upper substrate 13a and a plurality of lands 11b are also arranged on the upper surface of lower substrate 13b. The lower surface of upper substrate 13a seen from below is shown in FIG. 6 and the upper surface of lower substrate 13b seen from above is shown in FIG. 7 where the semiconductor package in accordance with the present embodiment is separated into upper and lower BGA packages. In a comparison of FIG. 6 and FIG. 7, land 11a and land 11b are arranged in a mirror-image relation to each other, that is, in mirror symmetry. Therefore when upper substrate 13a is affixed to lower substrate 13b, the lands are opposed to each other respectively. Where the lands are opposed respectively, the lands are electrically connected to each other with solder balls 5 interposed therebetween. This state is partially shown in detail, taking solder ball 5 on the right end as an example in FIG. 5. A signal path extending from land 11b is electrically drawn onto the lower surface of lower substrate 13b through through-hole 14 passing through lower substrate 13b, to connect to any one of solder balls 6.

Lands 11a and 11b are electrically connected to any bonding pads 9a and 9b with substrate wires 10a and 10b arranged on the surfaces of the substrates, respectively.

It is noted that all the lands are not necessarily in mirror symmetry. The lands in mirror symmetry may be part of a plurality of lands and another part of lands are arranged in a manner different between the upper and lower levels.

As shown in FIG. 6, a bonding pad 8a of semiconductor chip 7a on the upper side is exposed from an opening portion 15a of upper substrate 13a. As shown in FIG. 7, a bonding pad 8b of semiconductor chip 7b on the lower side is exposed from an opening portion 15b of lower substrate 13b. As shown in FIG. 6, boding pad 8a and bonding pad 9a are connected with wire 12, and as shown in FIG. 7, bonding pad 8b and bonding pad 9a are connected with wire 12. As can be seen from FIGS. 6 and 7 in comparison, the connection patterns of wire 12 are opposite to each other between the upper level and the lower level. By changing the connection pattern of wire 12 between the upper and lower levels in this way, a connection that appropriately corresponds to the lands arranged in mirror symmetry to each other on the upper and lower levels is realized while the arrangement pattern of the bonding pads of the semiconductor chip is common to the upper and lower levels.

As an example of the present embodiment, the specific sizes will be shown. In this example, the height of resin sealing portion 4a or 4b protruded from the substrate surface is not more than 0.15 mm. The arrangement pitch of lands provided on each substrate for connecting solder balls 5 is 0.8 mm. The diameter of solder ball 5 is 0.45 mm. However, this is the case where the total height of resin sealing portions 4a and 4b from the substrate surfaces is 0.3 mm. If the total height of resin sealing portions 4a and 4b from the substrate surfaces is smaller than 0.3 mm, the diameter of solder ball 5 may be made smaller.

Solder balls 6 for external connection are arranged with a pitch of 0.5 mm in a line on one side. In case of a pitch of 0.5 mm, the diameter of solder ball 6 may be around 0.3 mm in order to prevent short-circuit. Therefore the height that is protruded from the substrate surface of semiconductor chip 7b on the lower side of lower substrate 13b should be not more than 0.25 mm.

In the semiconductor package in accordance with the present embodiment, resin sealing portions 4a and 4b of the wire connection portions are arranged in the direction in which they are opposed to each other to be stacked. Since the height of the resin sealing portion covering wire 12 that is protruded from the substrate surface is generally lower than the height of the resin sealing portion covering semiconductor chip 7a or 7b body that is protruded from the substrate surface, the distance between the upper and lower substrates can be reduced in the semiconductor package in accordance with the present embodiment, as compared with the conventional stacked structure. Therefore solder ball 5 having a small diameter can be used for the connection between the substrates. Accordingly the arrangement pitch of solder balls 5 can be made small. As a result, an area necessary to arrange solder balls 5 can be reduced.

In the semiconductor package in accordance with the present embodiment, the body of semiconductor chip 7b that is protruded on the lower side of lower substrate 13b is lower than solder ball 6 and is not sealed with resin as it is less necessary to be protected. Therefore, as solder ball 6 for external connection arranged on the lower surface of lower substrate 13b, one with a smaller diameter can be used. Therefore the arrangement pitch of solder balls 6 can be reduced. As a result, an area necessary to arrange solder balls 6 can be reduced.

In the semiconductor package in accordance with the present embodiment, by changing the connection pattern of wire 12 between the upper and lower levels, a connection that appropriately corresponds to the lands arranged in mirror symmetry to each other on the upper and lower levels is realized while the arrangement pattern of the bonding pads of the semiconductor chip is common to the upper and lower levels. Therefore as to semiconductor chips, products in mirror symmetry need not be provided and common products can efficiently be used.

Figure 8:
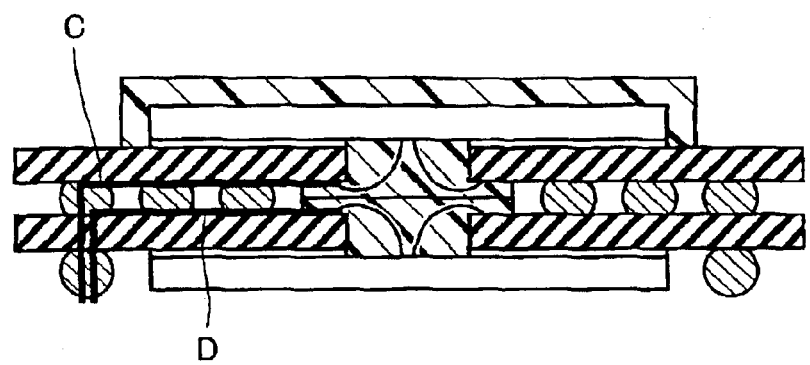
FIG. 8 is an illustration of an interconnection length for the upper and lower semiconductor chips of the semiconductor package in accordance with the first embodiment of the present invention.

In the semiconductor package in accordance with the present embodiment, as indicated by bold lines C and D in FIG. 8, the upper and lower semiconductor chips are approximately equal in the interconnection distance to the electrode for external connection. Therefore the problem of a transmission delay between the upper level and the lower level can be eliminated.

(Second Embodiment)

Figure 9:
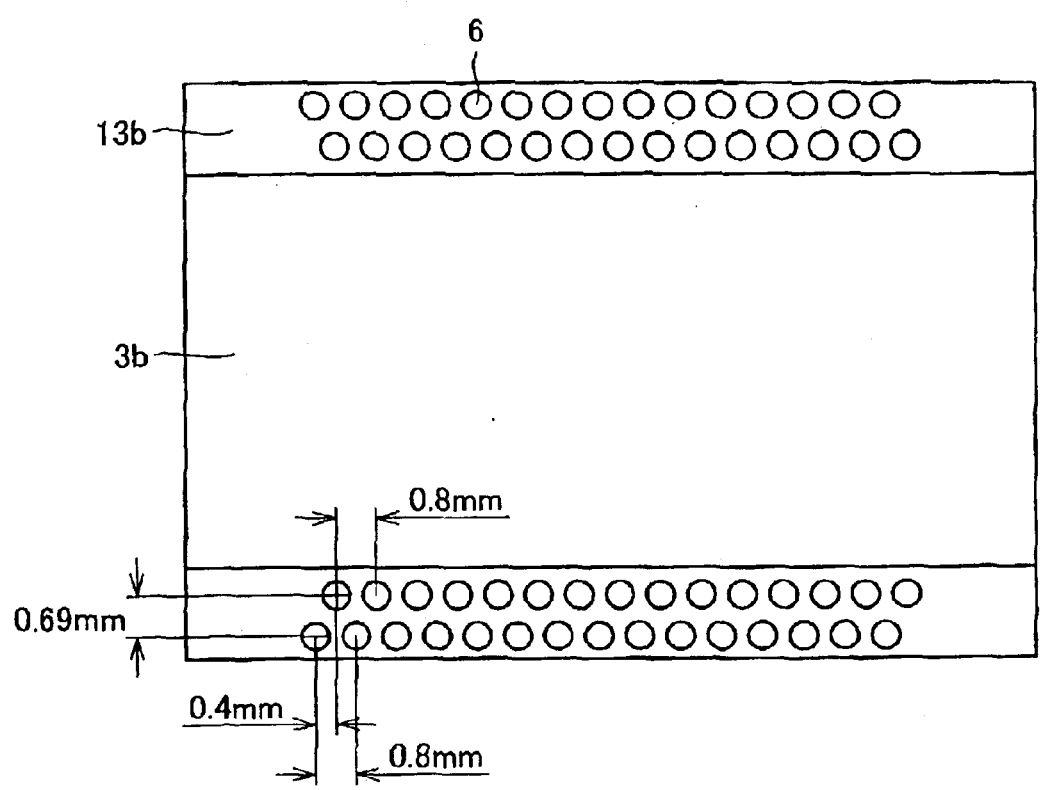
FIG. 9 is an underside view of the semiconductor package in accordance with a second embodiment of the present invention.
Figure 10:
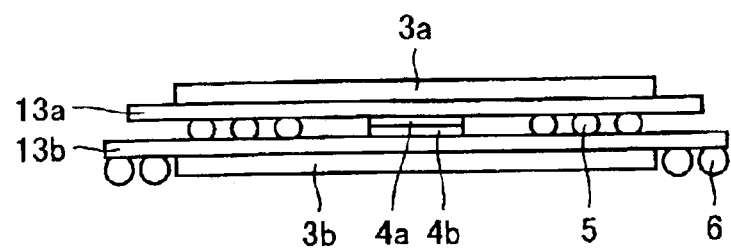
FIG. 10 is a front view of the semiconductor package in accordance with the second embodiment of the present invention.
Figure 11:
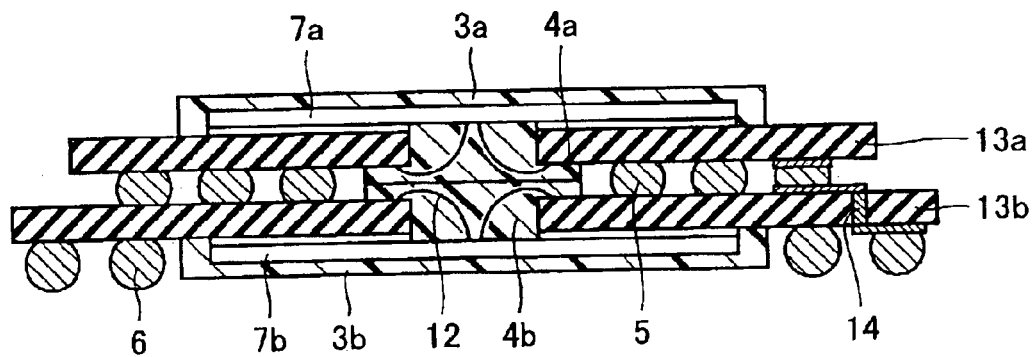
FIG. 11 is a cross sectional view of the semiconductor package in accordance with the second embodiment of the present invention.

Referring to FIGS. 9 to 11, the semiconductor package in accordance with a second embodiment of the present invention will be described. The semiconductor package in accordance with the present embodiment is similar to that illustrated in the first embodiment in the basic structure but is different in some points. First, the arrangement of solder balls 6 for external connection is different. More specifically, as shown in FIG. 9, solder balls 6 are arranged in two lines on one side in a zigzag pattern. As to the specific sizes, as shown in FIG. 9, the pitch in the longitudinal direction is 0.8 mm, and the center-to-center distance between the outer line and the inner line is 0.69 mm. The outer line is shifted from the inner line by 0.4 mm in arrangement.

Next, the present embodiment is different from the first embodiment in that a resin sealing portion 3b covering semiconductor chip 7b is provided.

In this manner, if solder balls 6 for external connection are arranged in two lines on one side in a zigzag pattern, the number of solder balls that can be arranged can largely be increased only by increasing the package width.

Furthermore, as described above, when the pitch of solder balls 6 in the longitudinal direction is 0.8 mm, the diameter of solder ball 6 may be around 0.45 mm in order to prevent short-circuit. Therefore a solder ball having a diameter of around 0.3 mm is used in the first embodiment whereas a solder ball having a larger diameter of about 0.45 mm can be used in the present embodiment. With a larger diameter of a solder ball for external connection, the upper limit of the protrusion of the resin sealing portion that is allowable on the lower side of lower substrate 13b is increased from 0.25 mm of the first embodiment to 0.35 mm. Therefore semiconductor chip 7b protruding downward may also be covered with resin for protecting the body itself. It is for this reason that resin sealing portion 3b is provided in FIG. 11.

It is noted that even if the solder balls for external connection are arranged in two lines on one side, an arrangement other than a zigzag pattern may be possible. However the zigzag pattern is preferable as it allows for a higher density.

Furthermore, even if the solder balls for external connection are arranged in two lines on one side as in the present embodiment, whether resin sealing portion 3b is provided for semiconductor chip 7b protruding downward may be selected as appropriate.

In accordance with the present invention, the distance between the upper and lower substrates can be reduced as compared with the conventional structure having BGA packages simply stacked in the same direction. Therefore a solder ball having a small diameter can be used for the connection between the substrates. Accordingly the arrangement pitch of solder balls can be reduced. As a result, an area necessary to arrange the solder balls can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor package comprising:
    an upper substrate having an opening portion;
    a solder ball for connection between substrates that is arranged on a lower side of said upper substrate;
    a lower substrate arranged on a lower side of said solder ball for connection between substrates and having an opening portion;
    a solder ball for external connection connected on a lower surface of said lower substrate;
    a first semiconductor chip arranged on an upper surface of said upper substrate; and
    a second semiconductor chip connected on a lower surface of said lower substrate, wherein
    said first semiconductor chip is electrically connected to said solder ball for connection between substrates through the opening portion of said upper substrate, said second semiconductor chip is electrically connected to said solder ball for connection between substrates through the opening portion of said lower substrate, and said solder ball for connection between substrates is electrically connected to said solder ball for external connection,
    an interconnection line pattern on a lower surface of said upper substrate seen from below and an interconnection line pattern on an upper surface of said lower substrate seen from above include regions in a mirror-image relation to each other, and
    the interconnection line pattern on said upper substrate is formed so as to be asymmetrical with respect to a line corresponding to a row of bonding pads disposed on said first semiconductor chip used for connection to said solder ball for connection between substrates, and the interconnection line pattern on said lower substrate is formed so as to be asymmetrical with respect to a line corresponding to a row of bonding pads disposed on said second semiconductor chip used for connection to said solder ball for connection between substrates.

2. The semiconductor package according to claim 1, wherein
    an electrical connection between said first semiconductor chip and said solder ball for connection between substrates and an electrical connection between said second semiconductor chip and said solder ball for connection between substrates are performed by connecting said bonding pads on a semiconductor chip side to bonding pads on a substrate side respectively using wires, a connection pattern of said wire between said first semiconductor chip and said solder ball for connection between substrates as seen from below and a connection pattern of said wire between said second semiconductor chip and said solder ball for connection between substrates as seen from above include regions that are opposite to each other.

3. The semiconductor package according to claim 2, wherein
    said solder balls for external connection are arranged in two lines on one side in a zigzag pattern.

* * * * *